United States Patent
Habersetzer et al.

(10) Patent No.: US 6,255,837 B1
(45) Date of Patent: Jul. 3, 2001

(54) APPARATUS AND METHOD DISABLING AND RE-ENABLING ACCESS TO IC TEST FUNCTIONS

(75) Inventors: Daryl L. Habersetzer; Casey R. Kurth, both of Boise; Patrick J. Mullarkey, Meridian; Jason E. Graalum, Boise, all of ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/567,632

(22) Filed: May 9, 2000

Related U.S. Application Data

(62) Division of application No. 09/222,674, filed on Dec. 29, 1998, now Pat. No. 6,160,413, which is a continuation of application No. 08/781,086, filed on Jan. 9, 1997, now abandoned, which is a division of application No. 08/498,823, filed on Jul. 6, 1995, now Pat. No. 5,627,478.

(51) Int. Cl.$^7$ .............................. G01R 31/28; G11C 7/00
(52) U.S. Cl. ......................... 324/763; 324/765; 365/201; 714/733
(58) Field of Search ................................. 324/763, 765, 324/158.1; 365/201; 714/718, 724, 733, 734

(56) References Cited

U.S. PATENT DOCUMENTS

| | | | |
|---|---|---|---|
| 4,398,146 | 8/1983 | Draheim et al. | 324/765 |
| 4,733,168 | 3/1988 | Blankenship et al. | 324/158.1 |
| 5,155,704 | 10/1992 | Walther et al. | 365/201 |
| 5,161,159 | 11/1992 | McClure et al. | 324/158.1 |
| 5,212,442 | 5/1993 | O'Toole et al. | 365/201 |
| 5,349,290 | 9/1994 | Yamada | 324/763 |
| 5,384,741 | 1/1995 | Haraguchi et al. | 365/201 |
| 5,397,984 | 3/1995 | Koshikawa | 324/158.1 |
| 5,440,178 | 8/1995 | McClure | 327/34 |
| 5,467,468 | 11/1995 | Koshikawa | 714/726 |
| 5,493,532 | * 2/1996 | McClure | 365/201 |
| 5,596,537 | * 1/1997 | Sukegawa et al. | 365/201 |
| 5,651,011 | * 7/1997 | Keeth | 714/724 |
| 5,727,001 | 3/1998 | Loughmiller | 365/201 |

* cited by examiner

*Primary Examiner*—Ernest F. Karlsen
(74) *Attorney, Agent, or Firm*—TraskBritt

(57) ABSTRACT

A test-mode latching circuit residing on an integrated circuit with test circuitry and operational circuitry has an enable state and a disable state. In the enable state, a test key is able to be latched so as to trigger a test mode. In the disable state, test key inputs are not latched and, thus, test modes are not entered. Initially, the circuit is readily enabled so that the IC can be tested upon fabrication. The circuit is locked in a disable state before external sale. A re-enable circuit is present to preclude inadvertent switching of the latching circuit back into the enable state during customer operation. Safeguards are implemented to avoid inadvertently re-enabling the latching circuit. To re-enable the latching circuit, an out-of-spec voltage is applied to an anti-fuse capacitor or programmable logic circuit while an out-of-spec voltage of the sane or another signal is detected at a field device. In one embodiment, the state switches to the enable state in response to the out-of-spec voltage. In alternative embodiments, an additional or subsequent signal, such as a prescribed clock pattern, occurs before the first circuit switches to the enable state.

4 Claims, 4 Drawing Sheets

APPARATUS AND METHOD DISABLING AND RE-ENABLING ACCESS TO IC TEST FUNCTIONS

CROSS-REFERENCE TO RELATED APPLICATIONS

This application is a divisional of application Ser. No. 09/222,674, filed Dec. 29, 1998, now U.S. Pat. No. 6,160,413, which is a continuation of application Ser. No. 08/781,086, filed Jan. 9, 1997, abandoned, which is a divisional of application Ser. No. 08/498,823, filed Jul. 6, 1995, now U.S. Pat. 5,627,478.

BACKGROUND OF THE INVENTION

This invention relates generally to methods and apparatus for on-chip testing of integrated circuits ("IC's") and, more particularly, to a method and apparatus for enabling and disabling access to IC test modes and test functions.

Very large-scale integrated (VLSI) circuit chips manufactured with modem IC technologies routinely include hundreds of thousands of circuit devices (e.g., transistors). As the number of on-chip devices increases, the complexity of circuit permutations increases. To adequately test VLSI chips, built-in test devices commonly reside on the IC substrate with operational circuitry.

Resident test circuits often are accessed via the same chip pins as the operational circuits. To initiate a test operation, a prescribed signal pattern is applied to the chip under test. To avoid inadvertent entry into a test mode, application of a known out-ofspec voltage (e.g., "super-voltage") to a prescribed pin may be required throughout the test procedure. There is concern, however, with continually applying an out-of-spec voltage. Specifically, applying an out-of-spec voltage for an extended period of time can damage the IC and its internal circuits. Another concern is that leakage specifications for the prescribed pin may not be met. Yet another concern is that the out-of-spec voltage may alter the electrical properties of the IC substrate during the time the voltage is applied. If so, then functional and performance results occurring in a test mode may differ from those in normal operating modes. Another concern is that the out-of-spec voltage level may fall during a test procedure so as to be within specification. This inadvertently terminates the test mode. When simultaneously testing many IC's, uneven power signal distribution will cause such variation of the out-of-spec voltage, terminating the test mode for one or more IC's. Accordingly, there is need for an alternate manner of preventing inadvertent entry into (and out of) a test mode.

BRIEF SUMMARY OF THE INVENTION

According to the invention, a test-mode latching circuit includes disable/reenable capability. The test-mode latching circuit is part of test circuitry residing on a common IC host with operational circuitry. The test circuitry is accessed to perform test functions on the operational circuitry during a test mode. A test mode for a given test function is entered by latching a test mode identification key into a test-mode latching circuit. In response to the test key, a corresponding test function occurs. For some test functions, the appropriate test key triggers a self-test process. For other test functions, the appropriate test key puts the IC into a specific test mode for receiving and responding to test vectors.

According to one aspect of the invention, the test-mode latching circuit includes an enable state and a disable state. In the enable state, a test key is able to be latched so as to trigger a test mode. In the disable state, a test key is not latched, and thus, test modes are not entered.

According to another aspect of the invention, the test-mode latching circuit includes a disable circuit, a re-enable circuit, control logic and a latch. The latch is for storing the test key. The disable circuit is for triggering a change into the disable state. The re-enable circuit is for triggering a change into the enable state. The control circuit is coupled to the disable circuit, re-enable circuit and latch and defines the state of the latch as disable or enable based signal levels input from the disable circuit and enable circuit.

In one embodiment, the test-mode latching circuit initially is in an enable state. As a result, accessing test modes upon initial fabrication of the IC is a simple process. Upon completion of factory testing, the disable circuit activates a test-key disable signal. The control logic responds to the disable signal to put the test-mode latching circuit in the disable state. Once disabled, test modes cannot be accessed again until the test-mode latching circuit is put into an enable state.

In one embodiment, the disable circuit and/or re-enable circuit include an antifuse capacitor. The disable circuit's capacitor responds to a super-voltage to activate the test-key disable signal. Similarly, the re-enable circuit's capacitor responds to a supervoltage to activate the test-key re-enable signal. In another embodiment, the disable circuit and/or enable circuit include a programmable logic device (e.g., flash cell) for responding to the super-voltage to activate the test-key disable signal or test-key re-enable signal.

According to another aspect of the invention, the re-enable circuit includes a "super-voltage" detect circuit which detects an out-of-spec voltage having a magnitude above a prescribed threshold level. According to one embodiment of the invention, the super-voltage detect circuit includes a field device. In response to a threshold out-of-spec voltage ("super-voltage"), the field device switches a signal to allow the anti-fuse capacitor or programmable logic device (e.g., flash cell) to activate the test-key re-enable signal. The test-key re-enable signal is active while (i) the detect circuit detects the out-of-spec voltage, and (ii) the re-enable circuit receives an out-of-spec voltage (e.g., the capacitor shorts in response to the out-of-spec voltage, or the programmable logic device triggers a state change in response to the out-of-spec voltage).

An advantage of the field device embodiment is the absence of leakage at the IC pin coupled to the detect circuit. The super-voltage is sufficiently high to prevent unknowing users from accidentally enabling test modes.

According to another aspect of the invention, the out-of-spec voltage need not be maintained at the re-enable circuit to maintain the test-mode latching circuit in the reenable state. Typically, the IC would only be re-enabled at the factory after being returned from a customer. Such a chip is not likely to be re-sold. Thus, a single round of going from the initial enable state to the disable state to the re-enable state is all that is desired for conventional commercial purposes. The anti-fuse capacitor embodiment accomplishes such single round. In the programmable logic device (e.g., flash cell) embodiment, however, the disable and re-enable circuits can be reset to allow additional rounds of disable and re-enable states to be entered. Thus, once re-enabled, the flash cell is reset. The disable circuit then can put the test-mode latching circuit in a disable state and the re-enable circuit can put the test-mode latching circuit back into a re-enable state. The flash cell is reset each time a new round of disable/re-enable states are desired.

According to various embodiments, another signal also occurs before entry into a test mode. A combination of external clock signals occurs to latch a test key into the latch circuit of a host chip. For example, in a dynamic random access memory (DRAM) chip, write enable (WE) and column address strobe (CAS) low signals occur before a row address strobe (RAS) low signal occurs (i.e., a "WCBR" sequence). A WCBR sequence occurs to enter into the DRAM host's WCBR test modes. In embodiments implementing such other signal(s) (e.g., a WCBR sequence), the test-mode latching circuit is initially enabled by the other signal. Once the disable circuit activates the test-key disable signal, the latching circuit stays in the disable state until the re-enable circuit activates the test-key re-enable signal. Once, the test-key re-enable signal is activated, the latching circuit is re-enabled by the other signal (e.g., the WCBR sequence). Initially and while the test-key re-enable signal is active, the latching circuit may be repeatedly switched between the disable state and reenable state by the other signal (e.g., WCBR sequences).

One advantage of the invention is that at the foundry, entry into test modes is a simple process. For the unknowing user, however, there are safeguards against inadvertent entry. Another advantage results from avoiding the continued use of an out-of-spec voltage during test procedures. By avoiding continued application of the out-of-spec voltage, one avoids the dangers of damaging the IC, changing the electrical properties of the IC, or prematurely terminating the test mode. These and other aspects and advantages of the invention will be better understood by reference to the following detailed description taken in conjunction with the accompanying drawings.

DETAILED DESCRIPTION OF THE INVENTION

Host IC Overview

Figure 1:
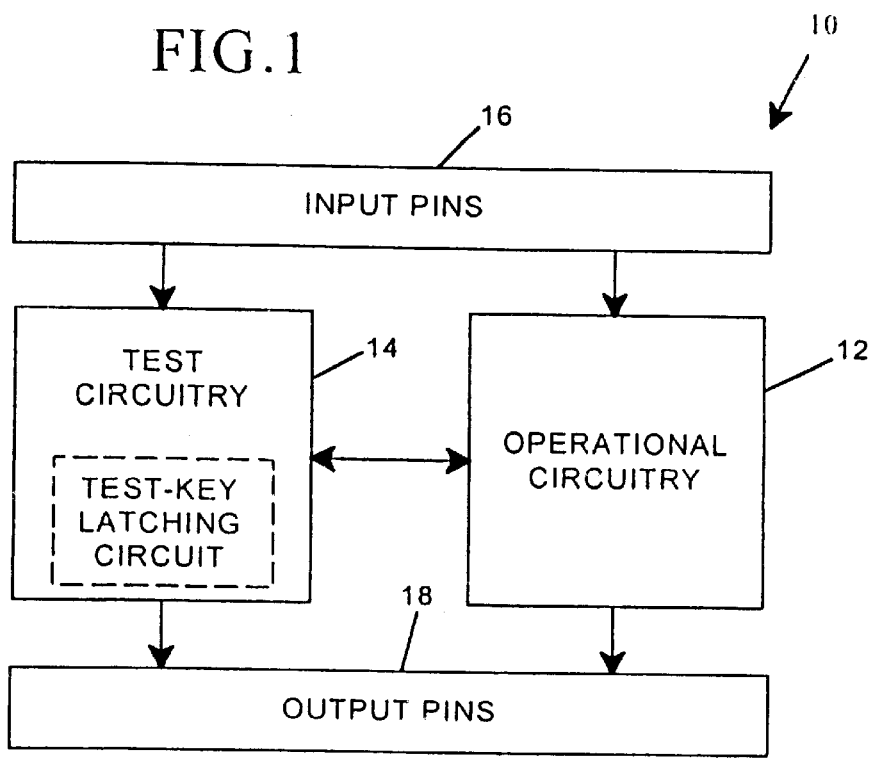
FIG. 1 is a block diagram of an integrated circuit having a resident test-mode latching circuit according to an embodiment of this invention.

FIG. 1 shows a block diagram of a host integrated circuit (IC) 10 having resident operational circuitry 12 and resident test circuitry 14. During normal operation, input signals are received at the operational circuitry 12 via input pins 16. The operational circuitry generates output signals routed off-chip via output pins 18. During test modes, input signals are received at the test circuitry 14 via the input pins 16. Input signals (e.g., test vectors) also may be received at the operational circuitry 12 during a test mode. The test circuitry 14 interfaces with the operational circuitry 12 during a test mode (i) to apply data, timing and/or control signals to the operational circuitry, and (ii) to receive responsive data, timing and/or control signals from the operational circuitry. Test result data is output off-chip from the test circuitry 14 and/or operational circuitry 12 via output pins 18. In addition, some embodiments include test points (not shown) for accessing on-chip signals away from the input pins 16 and output pins 18.

The test circuitry 14 includes a test-mode latching circuit 20 according to an embodiment of this invention. The latching circuit 20 serves to latch in a test key in response to test key select inputs. Typically, a host IC may enter into a test mode to perform any of multiple test functions. The test function is selected by the test key. For the test circuitry 14 to recognize the test key, the test key is to be latched in the test-mode latching circuit 20.

A dynamic random access memory (DRAM) host IC has test keys for various respective test functions. Exemplary test functions of the DRAM embodiment include: JEDEC-standard test mode for host IC; reduce data compression by one-half; disable WCBR as standard entry test key for JEDEC mode; enable firing four rows at once; disable DRAM cell plate bias circuit; enable redundant column testing, enable reading disable circuit or re-enable circuit state; test mode latch indication; or other modes.

Other types of host IC's 10 also include one or more test functions initiated by a corresponding test key. Other exemplary host ICs include random access memory (RAM) read-only memory (ROM), microprocessor, programmable logic devices, digital signal processors, dedicated controller devices and other prescribed logic or processing devices.

Test-Mode Latching Overview

According to the invention, the test-mode latching circuit 20 includes an enable state and a disable state. In the enable state, a test key is able to be latched so as to trigger a test mode. In the disable state, a test key is not latched, and thus, test modes are not entered. Change between the states is caused, at least in part, by an out-of-spec voltage signal (i.e., a "super-voltage" signal).

Figure 2:
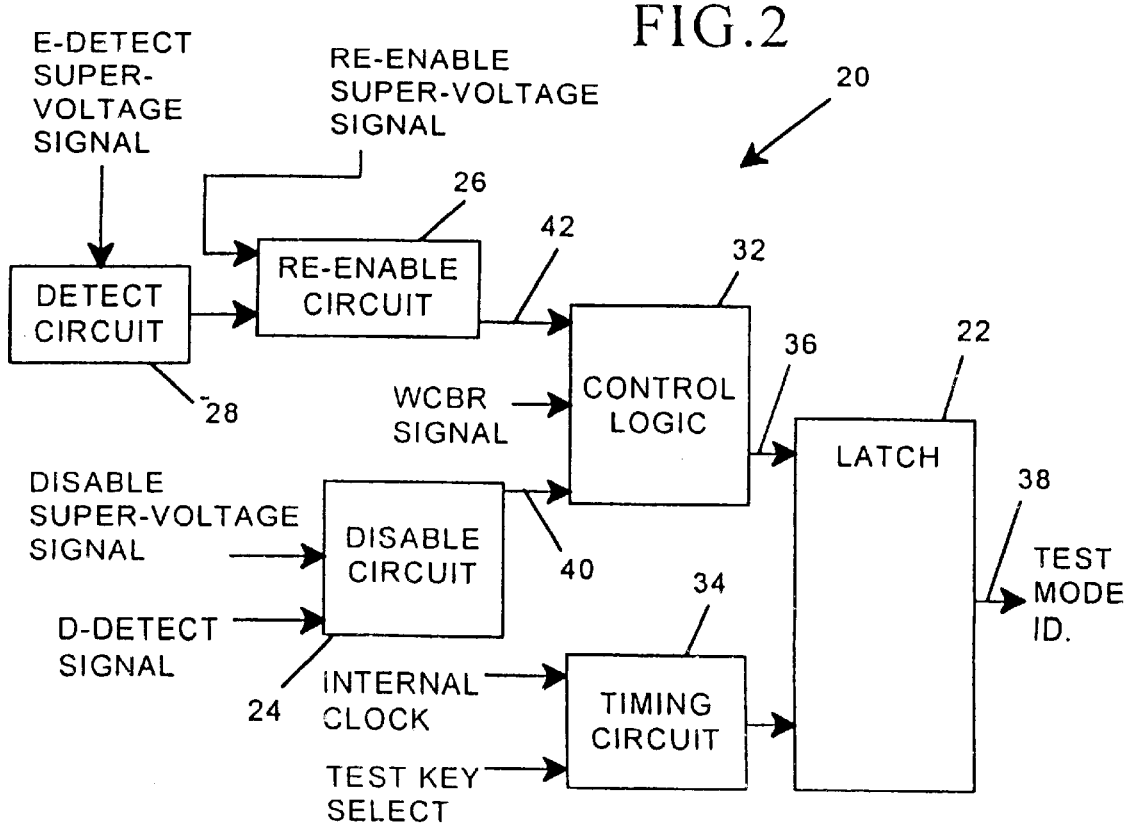
FIG. 2 is a block diagram of the test-mode latching circuit of FIG. 1 according to an embodiment of this invention.

FIG. 2 shows a test-mode latching circuit 20 according to one embodiment of this invention. The circuit 20 includes a latch 22, disable circuit 24, re-enable circuit 26, detect circuit 28, control logic 32 and a timing circuit 34. A test mode enable signal 36 defines the enable/disable states of the latch 22 and latching circuit 20. A test-key select signal along with an internal clock signal are received at a timing circuit 34 which in turn generates a test-key input to the latch 22. When the test mode enable signal 36 defines an enable state, the latch 22 accepts and latches the test key. Thus, the latch 22 generates a test mode identification signal 38.

The disable circuit 24, re-enable circuit 26 and control logic 32 define the state of the test mode enable signal. In one embodiment, the test-mode latching circuit 20 is fabricated to have the test mode enable signal initially define an enable state. Such circuit 20 remains in the enable state until the disable circuit triggers a change of state. In other embodiments, the circuit 20 is fabricated to have the test mode enable signal switch to the enable state upon receipt of a prescribed signal pattern (e.g., a WCBR sequence). Initially, the circuit 20 switches between a disable state and enable state in response to the prescribed signal pattern. To prevent switching into the enable state, the disable circuit 24 activates a test-key disable signal 40. The control logic 32 responds to the active test-key disable signal 40 to maintain the disable state (e.g., change the state of the test mode enable signal from the enable state to the disable state, or keep the test mode enable signal at the disable state).

According to the preferred embodiment, the disable circuit 24 generates an active test-key disable signal 40 when two conditions are present. As one condition, the disable circuit 24 receives a d_detect signal indicating that the disable circuit 24 can be programmed. In one embodiment, a standard logic "1" voltage signal corresponds to an active d_detect signal. In another embodiment, an out-of-spec voltage, referred to herein as a "Super-voltage," corresponds to an active d_detect signal. As the second condition, a super-voltage signal (i.e., disable super-voltage signal) is received at the disable circuit 24. The test-key disable signal 40 goes active while both conditions are met. Once the test key disable signal 40 goes active, it remains active. With the disable signal 40 active, the test-mode enable signal 36 is held in the disable state even after the super-voltage signal(s) are removed. In other embodiments, the disable circuit 24 can be reset to deactivate the test-key disable signal 40.

The re-enable circuit 26 defines a test-key re-enable signal 42. While the testmode latching circuit 20 is in the disable state, the control logic 32 responds to an active test-key re-enable signal 42 to allow the state of the test mode enable signal 36 to switch the disable state to the enable state. In some embodiments, the control logic 32 makes such state change in response to the active test-key re-enable signal 42. In other embodiments, both the test-key re-enable signal 42 is active and a prescribed signal or signal pattern is active (e.g., a WCBR sequence).

According to the preferred embodiment, the re-enable circuit 26 generates an active test-key re-enable signal 42 when two conditions are present. As one condition, the detect circuit 28 detects an out-of-spec voltage, referred to herein as a "Super-voltage." Specifically, a signal, labeled as e_detect super voltage signal on FIG. 2, is received at the detect circuit 28. In response, the circuit 28 enables the re-enable circuit 26 to respond to the second condition. As the second condition, the same or another super-voltage signal (i.e., re-enable super-voltage signal) is received at the reenable circuit 26. The test-key re-enable signal 42 goes active while both conditions are met. Once the test mode enable signal 36 goes active, it remains active. Thereafter, the circuit 20 can be changed into the enable state even after the super-voltage signals are removed (from detect circuit 28 and re-enable circuit 26). In other embodiments, the reenable circuit 26 can be reset to deactivate the test-key re-enable signal 42.

The term "super-voltage" as used herein means a signal magnitude level greater than specification rating signal levels for the host integrated circuit. An integrated circuit has specification rating signal levels corresponding to a logic level "1" and a logic level "0." The absolute value of such voltage levels varies according to the IC technology, (e.g., CMOS; ECL). According to one embodiment for CMOS IC's, a super-voltage of approximately 8–9 volts corresponds to an active re-enable super-voltage signal, an active disable super-voltage signal, and/or an active e_detect super-voltage signal. In another embodiment, the super-voltage signals have a voltage level exceeding a first threshold, the first threshold being greater than specification rating signal levels for the integrated circuit. For example, in a CMOS IC, threshold level is 5.5 volts and the super-voltage level is greater than 5.5 volts. Typical values would be 8–9 volts.

In some embodiments, the active d_detect signal also is a super-voltage. Although 8–9 volts is a typical value, alternate embodiments use lower super voltages of 6–7 volts. This is because the IC 10's latching circuit 20 is disabled at the factory where less safeguarding is needed to avoid inadvertent state changes.

Disable Circuit Schematic

Figure 3:
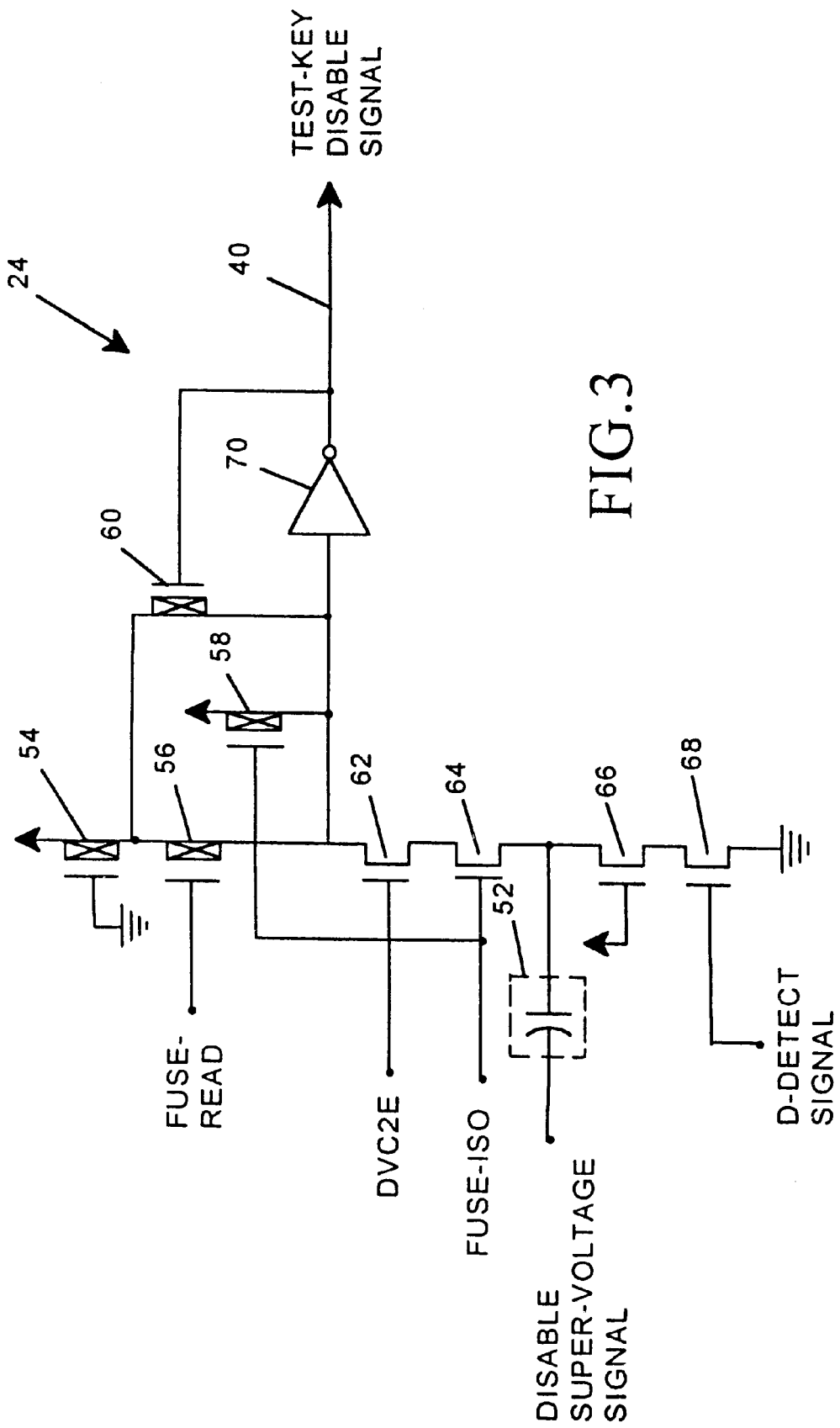
FIG. 3 is a circuit diagram of the disable circuit of FIG. 2 according to an embodiment of this invention.

FIG. 3 shows a disable circuit 24 schematic according to one embodiment. The disable circuit 24 serves to define a logic state for the test key disable signal 40. An active test key disable signal 40 is used to (i) trigger a state change in the test-mode latching circuit 20 from the enable state to the disable state, or (ii) if already in the disable state, to maintain the test-mode latching circuit 20 in the disable state. The disable circuit 24 includes an anti-fuse capacitor 52, several p-channel CMOS transistors 54, 56, 58, 60, several n-channel CMOS transistors 62, 64, 66, 68, and an inverter 70. The antifuse capacitor 52 serves to trigger a level change in the disable circuit's output signal, (i.e., the test-key disable signal 40). Specifically, the anti-fuse capacitor 52 is shorted to perform such function. The transistors 62–68 serve to determine when the anti-fuse capacitor is able to be shorted. The transistors 54–60 and inverter 70 maintain the logic level of the test key disable signal 40.

To activate the test key disable signal 40, the d_detect signal goes active and the disable super-voltage signal goes active, while fuse_ISO is held at ground. While the d_detect signal and the disable super-voltage signal are active, the anti-fuse capacitor 52 shorts. The anti-fuse capacitor 52 remains in the shorted state thereafter. Once shorted, the d_detect signal and disable super-voltage signals are deactivated (e.g., set to ground). While programming the disable circuit 24, fuse_ISO is held at ground to isolate the supervoltage from the read portion (transistors 54–60) of the disable circuit 24.

The state of the anti-fuse capacitor 52 is read at the circuit output (i.e., at test-key disable signal 40) by (i) applying $V_{CC}$ to fuse_ISO, (ii) applying one-half $V_{CC}$ to DVC2E, and (iii) holding at ground fuse_read, the signal input to capacitor 52 and the signal input to transistor 68. If the anti-fuse capacitor 52 is not blown, the inverter 70 output is low. If the anti-fuse capacitor 52 is blown, the inverter 70 output is high.

In an alternate embodiment, another fuse device or programmable logic device is used instead of the anti-fuse capacitor. The anti-fuse capacitor 52 or other fuse-like device is used for embodiments where only a one-time activation of the test-key disable signal is needed. For such embodiments, once the test-key disable signal goes active in response to the shorted fuse, the test-key disable signal 40 remains active and is not switched inactive. A programmable logic device such as a flash cell is used in alternative embodiments where multiple rounds of activating and de-activating the test-key disable signal 40 are desired. For example, once the disable circuit 24 is set active, by resetting the programmable logic device, the disable circuit 24 output (e.g., test-key disable signal 40) switches back to a deactive state. Thus, the programmable logic device embodiment allows for multiple rounds of activating and de-activating the disable circuit 24 output.

Re-Enable Circuit and Detect Circuit Schematic

Figure 4:
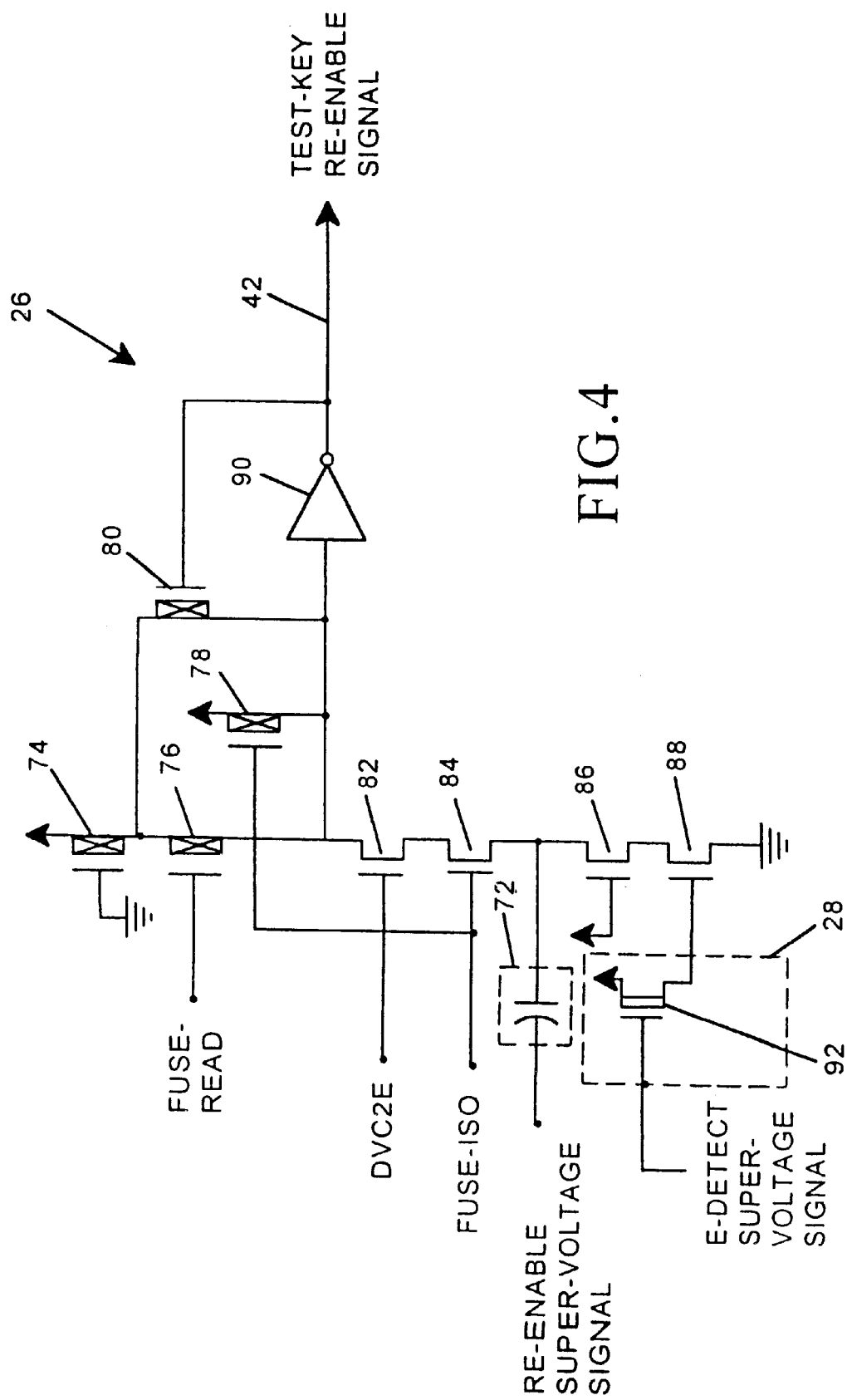
FIG. 4 is a circuit diagram of the re-enable circuit and detect circuit of FIG. 2 according to an embodiment of this invention.

FIG. 4 shows a re-enable circuit 26 and detect circuit 28 schematic according to one embodiment. The re-enable circuit 26 serves to define a logic state for the test key re-enable signal 42. An active test key re-enable signal 42 is used to allow a state change in the test-mode latching circuit 20 from the disable state to the enable state. The reenable circuit 26 includes an anti-fuse capacitor 72, several p-channel CMOS transistors 74, 76, 78, 80, several n-channel CMOS transistors 82, 84, 86, 88, and an inverter 90. The anti-fuse capacitor 72 serves to trigger a level change in the re-enable circuit's output signal, (i.e., the test-key re-enable signal 42). Specifically, the anti-fuse capacitor 72 is shorted to perform such function. The transistors 82-88 serve to determine when the anti-fuse capacitor 72 is able to be shorted. The transistors 74–80 and inverter 90 maintain the logic level of the test key re-enable signal 42. The detect circuit 28 includes a field device, such as a field effect transistor. In a preferred embodiment, a field transistor 92 is used. Field transistor 92 has its gate atop a thick layer of isolation oxide so as to tolerate a higher threshold voltage and a higher gate to substrate breakdown voltage.

To activate the test key re-enable signal 42, (i) a super-voltage signal is applied to the detect circuit 28 as the e_detect super-voltage signal, while (ii) the same or another super-voltage is applied to the anti-fuse capacitor 72 as the re-enable super-voltage signal, and (iii) fuse_ISO is held at ground. While the e_detect super-voltage signal and the re-enable super-voltage signal are active, the anti-fuse capacitor 72 shorts. The anti-fuse capacitor 72 remains in the shorted state thereafter. Once shorted, the e_detect and disable super-voltage signal states are deactivated (e.g., held to ground). During programming, fuse_ISO is held at ground to isolate the super-voltage from the read portion (transistors 74–80) of the circuit 26.

The state of the anti-fuse capacitor 72 is read at the circuit output (i.e., test-key re-enable signal 42) by (i) applying $V_{CC}$ to fuse_ISO, (ii) applying one-half $V_{CC}$ to DVC2E and (iii) holding to ground fuse_read, the input to capacitor 72 and the input to transistor 88. If the anti-fuse capacitor 72 is not blown, the inverter 90 output is low. If the anti-fuse capacitor 72 is blown, the inverter 90 output is high.

In an alternate embodiment, another fuse device or programmable logic device is used instead of the anti-fuse capacitor. The anti-fuse capacitor 72 or other fuse-like device is used for embodiments where only a one-time change in the test-key enable signal (e.g., from inactive to active) is needed. For such embodiments, once the test key re-enable signal goes active in response to the shorted fuse, the test key re-enable signal remains active and is not switched inactive. A programmable logic device such as a flash cell is used in alternative embodiments where multiple rounds of activating and deactivating the test-key re-enable signal are desired. For example, once the re-enable circuit 26 is allowed to go through a first round of state changes (i.e., inactive to active), by resetting the programmable logic device, the re-enable circuit 26 output (e.g., test-key re-enable signal 42) switches back to a deactivated state. Thus, the programmable logic device embodiments allow for multiple rounds of activating and deactivating the re-enable circuit 26 output. Discounting the changes caused by the prescribed signal pattern, programmable logic devices at both the disable circuit 24 and re-enable circuit 26 allow the test-mode latching circuit 20 to go through multiple iterations of enable, disable, reenable state changes.

Because the host IC 10 is likely to be re-enabled in the commercial environment only upon being returned to the factory due to some defect, there often is no need to provide for another round of state changes. Re-enabling is provided to allow those at the factory to evaluate the defect. Thereafter, the IC 10 typically is not re-sold, but instead is discarded. Accordingly, a fuse-like device serves the typical commercial application.

Control Logic Timing Circuit and Latch Schematic

Figure 5:
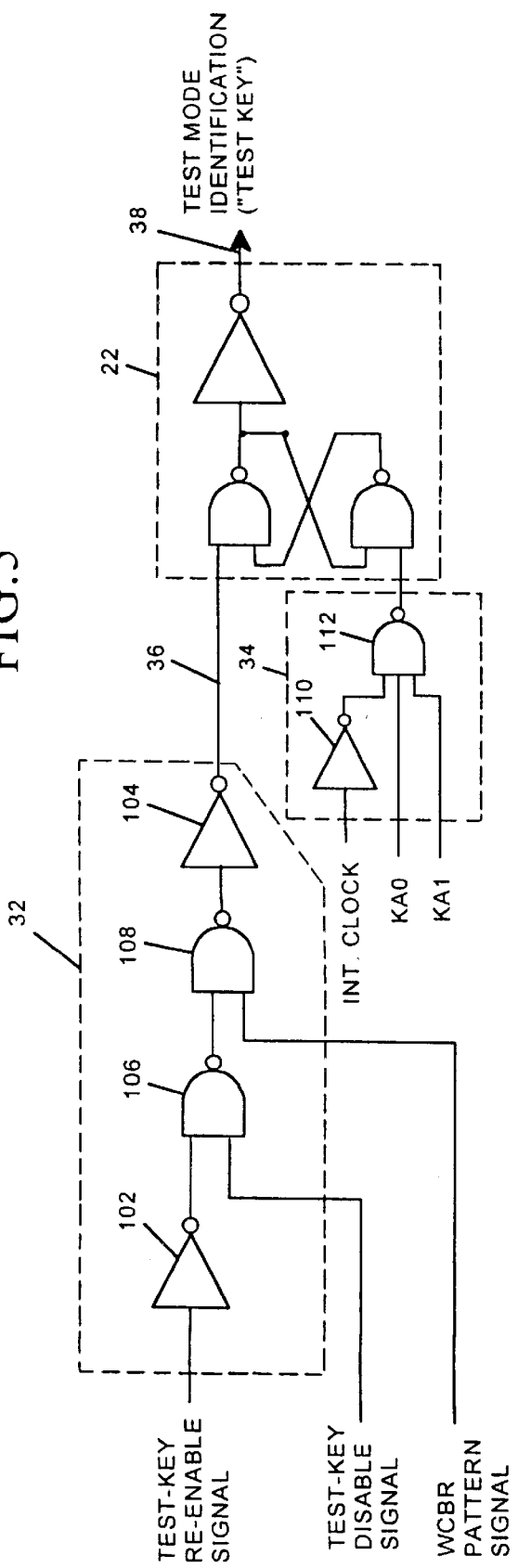
FIG. 5 is a logic circuit diagram of the control logic, timing circuit and latch of FIG. 2 according to an embodiment of this invention.

FIG. 5 shows a schematic diagram of the control logic 32, timing circuit 34 and latch 22 according to one embodiment of this invention. The control logic 32 defines the state of the test mode enable signal. The state of such signal 36 is the state (i.e., enable or disable) of the test-mode latching circuit 20. The timing circuit 34 defines a test mode identification to be latched. Latch 22 latches in such test mode identification. The latch 22 output is the test-mode latching circuit 20 output, which is an identification of the test mode, (e.g., identification of test function(s) to be performed).

The control logic 32 receives the test-key disable signal 40, test-key re-enable signal 42, and, in some embodiments, a prescribed pattern signal. In one embodiment, the prescribed pattern signal is an external clock signal pattern (e.g., write enable and column address strobe low before row address strobe low—referred to as a WCBR pattern). In a specific embodiment, the control logic 32 includes a pair of inverters 102, 104 and a pair of NAND gates 106, 108, although different and/or additional circuit components can be used. The control logic 32 receives the test-key disable signal 40 at NAND gate 106, receives the test-key re-enable signal 42 at inverter 102, and receives the WCBR pattern signal at NAND gate 108.

Initially, the test-key disable signal 40 and test-key re-enable signal 42 are inactive. As a result, the test mode enable signal 36 defines the enable state whenever the WCBR pattern signal goes active. Once the test-key disable signal 40 goes active, the test mode enable signal 36 stays at the disable state regardless of the WCBR pattern signal level. Once the test-key re-enable signal 42 goes active, then the test mode enable signal 36 changes into the enable state whenever the WCBR pattern signal is active.

Table A below shows a logic table for the control circuit 32:

| Test-key re-enable signal 42 | I | I | I | A | A |
|---|---|---|---|---|---|
| Test-key disable signal 40 | I | I | A | N | N |
| WCBR pattern signal | I | A | N | I | A |
| Test Mode Enable signal 36 | D | E | D | D | E |

Where,
I=Inactive;
A=Active;
N=Do not care
D=Disable State
E=Enable State

Whenever the test mode enable signal 36 defines the enable state, latch 22 is able to latch in a value received from timing circuit 34. In one embodiment, timing circuit 34 includes an inverter 110 and NAND gate 112. The inverter 110 receives an internal clock signal. The NAND gate 112 receives the inverter 110 output along with the test key component signals. In one embodiment for a DRAM host IC, the test key select inputs are prescribed address lines (e.g. ka0, ka1). In a host having (4) test modes to choose from, (2) address lines are used to select among the four modes. For embodiments with a differing number of test modes, fewer or more address lines or other prescribed lines are input as needed, (e.g., input to the NAND gate 112, as needed). The internal clock signal determines when the test key signals (ka0, ka1) are sampled to define the input to latch 22.

Method for Avoiding Inadvertent Entry into IC Test Modes

According to one application of the test-mode latching circuit 20, it is desirable to enable easy access to test modes upon IC 10 fabrication prior to sale, while avoiding inadvertent entry into test modes once the IC 10 is sold. It also is desirable to re-enable access to test modes at a later time to evaluate any potential defects in a specific IC specimen. To enable easy access upon fabrication, the test-mode latching circuit 20 switches into the enable state whenever a prescribed signal (e.g., WCBR pattern signal) goes active (see Table A, first 2 columns). Such a state change occurs without the need of a super-voltage. Typically, a super-voltage serves as a safeguard. As the IC is being tested at the factory upon fabrication, such safeguard is not necessary.

Upon satisfactory testing and prior to release for sale, the test-mode latching circuit 20 is changed into the disable state. This is achieved by permanently activating the test-key disable signal 40. Now, regardless of the state of the prescribed signal, the circuit 20 state is disabled, (see Table A, third column). The only way to get back into a test mode is to activate the test-key re-enable signal 42. Once the test-key re-enable signal is re-activated, the circuit 20 state changes to enable whenever the prescribed signal goes active. To avoid inadvertent re-entry to the enable state, the re-enable circuit 26 activates the test-key refinable circuit only upon (i) detection of a super-voltage signal at a detect circuit 28 and (ii) shorting of its component fuse device (e.g., anti-fuse capacitor 72) (or in another embodiment, changing the state of its programmable logic device, e.g., flash cell). Thus, inadvertent entry by the user is avoided. The knowing test operator, however, applies such signals to activate the test-key re-enable signal. To facilitate such re-enabling without damaging the IC, a field transistor is used in one embodiment. This avoids leakage at the pin where a super-voltage is applied to the IC. Once the test-key re-enable signal is activated, it remains active, even after the super-voltages are removed. Thereafter, test modes are entered by activating the prescribed signal.

The test mode is selected from among one or more predefined test modes by a test key. The test key is input to the test-mode latching circuit 20. Only when the circuit 20 is in the enable state will the test key serve to latch in a test mode identification corresponding to the given test key. In one DRAM host IC embodiment, the prescribed signal is a signal indicating the presence of a WCBR sequence.

Meritorious and Advantageous Effects

One advantage of the invention is that at the foundry, entry into test modes is a simple process. For the unknowing user, however, there are safeguards against inadvertent entry. Another advantage results from avoiding the continued use of an out-of-spec "super-voltage" during test procedures. By avoiding continued application of the super-voltage, one avoids the dangers of damaging the IC, changing the electrical properties of the IC, or prematurely terminating the test mode.

Although a preferred embodiment of the invention has been illustrated and described, various alternatives, modifications and equivalents may be used. For example, although specific logic examples are described for the control logic 32, timing circuit 36 and latch 22, structures using alternate components can serve the same functions. For example, the latch 22 can be more complex to store a multiple-bit test mode identification. Similarly, the timing circuit can be altered to accommodate variously sized test keys. The control logic, as shown, receives a WCBR pattern signal input. However, in alternative embodiments, other external clock combinations, internal clock combinations, and/or control signals are substituted. In yet another embodiment, the third input (corresponding to the WCBR pattern signal) is omitted entirely with state changes based only on the test-key disable signal level and the test-key re-enable signal level. Also, although the specific circuit embodiments for the disable circuit 24 and re-enable circuit 26 employ CMOS devices, other IC technologies are used in other embodiments. Therefore, the foregoing description should not be taken as limiting the scope of the inventions which are defined by the appended claims.

What is claimed is:

1. A method for avoiding inadvertent entry into at least one test mode of a circuit, the method comprising:

providing a circuit having a first circuit in a disable state;

detecting at least a first signal at a signal level exceeding a threshold level greater than a specification rating signal level for the circuit;

detecting at least a second signal at a signal level exceeding the threshold level during detection of the at least a first signal; and changing the first circuit from the disable state to an enable state in response to detecting the at least a first and at least a second signals.

2. The method of claim 1, further comprising maintaining the first circuit in the enable state after changing the first circuit to the enable state, regardless of whether the at least a first and at least a second signals are subsequently detected.

3. The method of claim 2, wherein the method comprises avoiding inadvertent entry into at least one test mode of an integrated circuit.

4. The method of claim 1, wherein changing the first circuit from the disable state to the enable state in response to detecting the first and second signals comprises:

producing a test-key enable signal at a second circuit in response to detecting the at least a first and at least a second signals;

detecting the test-key enable signal at the first circuit; and changing the first circuit from the disable state to the enable state in response to detecting the test-key enable signal.

* * * * *

UNITED STATES PATENT AND TRADEMARK OFFICE
CERTIFICATE OF CORRECTION

PATENT NO. : 6,255,837 B1
DATED : July 3, 2001
INVENTOR(S) : Daryl L. Habersetzer et al.

It is certified that error appears in the above-identified patent and that said Letters Patent is hereby corrected as shown below:

Title page, Item [54] and Column 1, line 1,
Title, after "METHOD" insert -- FOR --

Title page,
Item [57], ABSTRACT,
Line 2, after "operational circuitry" insert -- that --

Drawings,
Please replace FIG. 5 with the following:

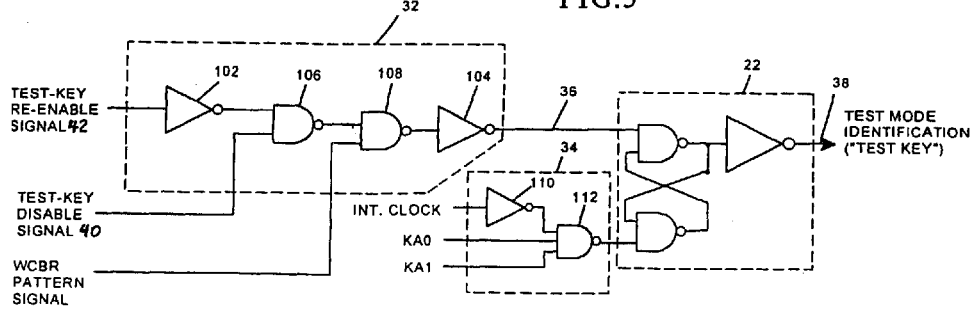

Column 1,
Line 22, change "modem" to -- modern --
Line 32, change "out-ofspec" to -- out-of-spec --

Column 4,
Line 25, after "(RAM)" insert -- , --

Column 9,
Line 19, change "refinable" to -- reenable --

UNITED STATES PATENT AND TRADEMARK OFFICE
CERTIFICATE OF CORRECTION

PATENT NO. : 6,255,837 B1
DATED : July 3, 2001
INVENTOR(S) : Daryl L. Habersetzer et al.

It is certified that error appears in the above-identified patent and that said Letters Patent is hereby corrected as shown below:

Column 10,
Line 2, change "timing circuit 36" to -- timing circuit 34--
Line 43, prior to each of "first" and "second" insert -- at least a --

Signed and Sealed this

Seventeenth Day of August, 2004

JON W. DUDAS
*Acting Director of the United States Patent and Trademark Office*